(12) United States Patent
Freedman (10) Patent No.: US 7,800,194 B2
(45) Date of Patent: Sep. 21, 2010

(54) THIN FILM PHOTODETECTOR, METHOD AND SYSTEM

(76) Inventor: Philip D. Freedman, 317 S. Fayette St., Alexandria, VA (US) 22314-5902

( * ) Notice: Subject to any disclaimer, the term of this patent is extended or adjusted under 35 U.S.C. 154(b) by 592 days.

(21) Appl. No.: 11/781,853

(22) Filed: Jul. 23, 2007

(65) Prior Publication Data

US 2007/0290287 A1 Dec. 20, 2007

Related U.S. Application Data (63) Continuation-in-part of application No. 11/627,961, filed on Jan. 27, 2007, now abandoned, and a continuation-in-part of application No. 11/381,583, filed on May 4, 2006, each which is a continuation-in-part of application No. 10/127,585, filed on Apr. 23, 2002, now Pat. No. 7,208,191.

(51) Int. Cl.
   *H01L 23/38* (2006.01)
(52) U.S. Cl. .............. 257/461; 257/E23.082; 257/E23.11; 257/E25.006
(58) Field of Classification Search ........ 257/461, 257/465, E23.082, E23.101, E23.11, E23.151, 257/E25.006, E25.007, E25.009, E27.124, 257/E27.125
See application file for complete search history.

(56) References Cited

U.S. PATENT DOCUMENTS

| | | |
|---|---|---|
| 4,082,570 A | 4/1978 | House |
| 4,200,472 A | 4/1980 | Chappell |
| 4,251,288 A | 2/1981 | Yerkes |
| 4,328,390 A | 5/1982 | Meakin |
| 4,404,422 A | 9/1983 | Green |
| 4,444,992 A | 4/1984 | Cox |
| 4,776,894 A | 10/1988 | Watanabe |
| 5,269,851 A | 12/1993 | Horne |
| 5,482,560 A | 1/1996 | Hockaday |
| 5,482,570 A | 1/1996 | Saurer |
| 5,547,774 A | 8/1996 | Gimzewski et al. |
| 5,714,791 A | 2/1998 | Chi |
| 5,885,368 A | 3/1999 | Lupo |
| 5,944,913 A | 8/1999 | Hiu |

(Continued)

FOREIGN PATENT DOCUMENTS

EP    0178148    4/1986

(Continued)

OTHER PUBLICATIONS

Ton Offermans, Charge carrier dynamics in polymer solar cells, Dutch Plymer Institute projec #324, pp. 1 to 125 (Oct. 31, 2005).

(Continued)

*Primary Examiner*—Evan Pert
*Assistant Examiner*—W. Wendy Kuo
(74) *Attorney, Agent, or Firm*—Philip D. Freedman PC (57) ABSTRACT

A photodetector, comprises a first section comprising at least one p-n junction that converts photon energy into a separate charge carrier and hole carrier; and another section of semiconductors of opposing conductivity type connected electrically in series and thermally in parallel in a heat dissipating and electric generating relationship to the cell to augment generation of electric energy of the first section.

16 Claims, 3 Drawing Sheets

U.S. PATENT DOCUMENTS

| | | |
|---|---|---|
| 6,072,116 A | 6/2000 | Brandhorst |
| 6,281,430 B1 * | 8/2001 | Lupo et al. ............... 136/263 |
| 6,282,907 B1 * | 9/2001 | Ghoshal .................... 62/3.7 |
| 6,347,521 B1 | 2/2002 | Kadotani et al. |
| 6,479,743 B2 | 11/2002 | Vaz |
| 6,512,291 B2 * | 1/2003 | Dautartas et al. ............ 257/706 |
| 6,689,949 B2 | 2/2004 | Ortabasi |
| 7,076,965 B2 | 7/2006 | Lasich |
| 7,180,231 B2 | 2/2007 | Gotoh |
| 7,188,797 B2 | 3/2007 | Dziendziel |
| 2002/0027238 A1 * | 3/2002 | Lin et al. .................... 257/292 |
| 2003/0236335 A1 | 12/2003 | Miller |
| 2004/0262744 A1 | 12/2004 | Dahl et al. |
| 2005/0045702 A1 | 3/2005 | Freeman |
| 2005/0274409 A1 | 12/2005 | Fetzer |
| 2006/0005944 A1 | 1/2006 | Wang |
| 2006/0185725 A1 | 8/2006 | Fatemi |
| 2006/0225782 A1 | 10/2006 | Berke |
| 2006/0243317 A1 | 11/2006 | Venkatasubramanian |
| 2007/0054435 A1 | 3/2007 | Yoon |
| 2007/0082140 A1 | 4/2007 | Suzuki |
| 2007/0153414 A1 | 7/2007 | Sullivan |

FOREIGN PATENT DOCUMENTS

| | | |
|---|---|---|
| JP | 04280482 A * | 10/1992 |
| WO | WO 2004057674 | 7/2004 |

OTHER PUBLICATIONS

Ramos, Rispens, Van Duren, Hummelen and Janssen, J. Am. Chem. Soc., vol. 123, pp. 6714-6715 (2001).

* cited by examiner

THIN FILM PHOTODETECTOR, METHOD AND SYSTEM

CROSS REFERENCE TO RELATED APPLICATION

This application is a continuation-in-part application of Freedman, Ser. No. 11/381,583 filed May 4, 2006 and Freedman Ser. No. 11/687,961 filed Jan. 27, 2007, both of which are continuation-in-part applications of Freedman Ser. No. 10/127,585, filed 23 Apr. 2002, now U.S. Pat. No. 7,208,191.

BACKGROUND OF THE INVENTION

The invention relates to a thin film photodetector, method and system, particularly to a thin film thermoelectric configured photodetector and more particularly to a photovoltaic cell with integral structure.

A thin film photodetector, for example a photovoltaic cell converts energy into electricity. Thin film photodetectors find application in photovoltaic devices Including solar cells, infrared sensors and photonic devices that absorb laser light that are applied in high speed optical transmission systems, for example as electro-absorption modulators, waveguide photodetectors, and semiconductor Mach-Zender modulators.

A thin film photovoltaic cell photogenerates charge carriers (electrons and holes) in a light-absorbing material, and separates the charge carriers to a conductive contact that transmits electricity. For example, a photovoltaic cell detects photons radiatively emitted by a light source. The cell converts the incident photons to charge carriers (electrons and holes) in a light absorbing material and the charge carriers are separated to a conductive contact that transmits electricity.

The wavelength ($\lambda$) of an incident photon is inversely proportional to its photon energy and can be calculated from $\lambda=hc/E$ where h is Planck's constant and c is the speed of light. Photons with energy greater than the semiconductor bandgap ($E_g$) (typically ranging from 0.50 to 0.74 eV for photovoltaic devices) excite electrons from the valence band to the conduction band of the semiconductor material (interband transition). The resulting electron-hole pairs are then collected and used to power electrical loads. Photons with energy less than the semiconductor bandgap cannot be converted to electrical energy and, therefore, are parasitically absorbed as heat. In some systems, improved photovoltaic conversion efficiency is attained by reducing the amount of below bandgap energy that is parasitically absorbed. But these mechanisms only depreciate the conversion efficiency of total incident photon energy to electric power by diverting some energy (albeit in the form of heat) away from the cell.

There is a need for an improved photodetector that converts a higher proportion of available photon energy into useable electric energy and method and system.

BRIEF DESCRIPTION OF THE INVENTION

The invention relates to an augmented photodetector that converts a higher proportion of available photon energy into useable electric energy and to a method and system.

In an embodiment, the invention is a photodetector, comprising; a first section comprising at least one p-n junction that converts photon energy into a separate charge carrier and hole carrier; and another section of semiconductors of opposing conductivity type connected electrically in series and thermally in parallel in a heat dissipating and electric generating relationship to the first section.

In an embodiment, the invention is a method of making a photodetector, comprising: forming at least one thin film electric interconnect on a electric insulating and thermal transmissive substrate; and disposing the substrate in a heat dissipating and electric generating relationship to at least one p-n junction that converts photon energy into a separate charge carrier and hole carrier.

In an embodiment, the invention is a solar cell, comprising: at least one p-n junction that converts photon energy into a separate charge carrier and hole carrier; and at least one thin film electric interconnect on an electric insulating and thermal transmissive substrate disposed in a heat dissipating and electric generating relationship to the at least one p-n junction.

In an embodiment, the invention is a method of making a photodetector, comprising: providing a first section comprising at least one p-n junction that converts photon energy into a separate charge carrier and hole carrier; and positioning semiconductors of opposing conductivity type connected electrically in series and thermally in parallel in a heat dissipating and electric generating relationship to the first section.

In another embodiment, the invention is a method of producing a photovoltaic cell, comprising forming a thermal conductive film on an electric insulating and thermal transmissive substrate and disposing the substrate with semiconductors of opposing conductivity type connected electrically in series and thermally in parallel in a heat dissipation and electric generating relationship to at least one p-n junction that converts photon energy into a separate charge carrier and hole carrier.

In another embodiment, the invention is a method of making a photodetector, comprising: providing a first section comprising at least one p-n junction that converts photon energy into a separate charge carrier and hole carrier; and positioning semiconductors of opposing conductivity type connected electrically in series and thermally in parallel in a heat dissipating and electric generating relationship to the cell.

In another embodiment, the invention is an infrared sensor, comprising; a first section comprising at least one p-n junction that converts photon energy into a separate charge carrier and hole carrier; and another section of semiconductors of opposing conductivity type connected electrically in series and thermally in parallel in a heat dissipating and electric generating relationship to the cell.

In still another embodiment, the invention is a method of making a structure, comprising providing a first section comprising at least one p-n junction that converts photon energy into a separate charge carrier and hole carrier; applying a patterned discontinuous fullerene thin film to a substrate surface to form at least one thin film interconnect; and positioning semiconductors of opposing conductivity type connected electrically in series and thermally in parallel by the at least one interconnect in a heat dissipating and electric generating relationship to the first section.

In still another embodiment, the invention is a photovoltaic cell comprising a photon to electric generating structure that comprises a substrate having a support face having a first electrode thereon and a second electrode spaced from the first electrode by a plurality of layers including at least one layer of a semiconducting material with an active junction (J) interface with a second layer of a second semiconducting type and a cooling structure comprising semiconductors of opposing conductivity type coupled electrically in series and thermally in parallel by a least one associated thin film, the cooling structure disposed in a heat dissipating a electric generating relationship to the photon to electric generating structure.

In still another embodiment, the invention is a system for generating electrical power from solar radiation, comprising: a receiver comprising at least one photovoltaic cell that can receive incidental solar energy or converting incident solar energy into electrical energy and incidental solar energy in the form of heat; and a thermoelectric element comprising an at least one thermoelectric material layer disposed between an n-type semiconductor and a p-type semiconductor in heat dissipating and electric generating relationship to the receiver.

In another embodiment, the invention is a thin film photodetector comprising a photovoltaic cell with a thermoelectric element, the thermoelectric element comprising p-type and n-type semiconductors formed between opposing electric insulators and opposing electron conductors.

In another embodiment, the invention is a thin film photodetector comprising an at least one thermoelectric material layer disposed between an n-type semiconductor and a p-type semiconductor, wherein the at least one thermoelectric material layer comprises a fullerene thin film deposited on a surface of a substrate.

In another embodiment, the invention is a thin film photodetector comprising semiconductors of opposing conductivity type coupled electrically in series and thermally in parallel by at least one associated surface discontinuous patterned fullerene thin film.

In another embodiment, the invention is a photovoltaic system, comprising at least one photodetector cell comprising a substrate having a support face having disposed thereon a first electrode and a second electrode separated from the first electrode by a plurality of layers comprising at least a first layer of a first semiconducting type and at least a second layer of a second semiconducting type with an active junction at an interface of the first layer and second layer; and semiconductors of opposing conductivity type connected electrically in series and thermally in parallel in a heat dissipating and electric generation relationship.

DETAILED DESCRIPTION OF THE INVENTION

In an embodiment, the invention relates to a photodetector for converting solar radiation to electrical energy. A photodetector converts incident photon energy into electricity. A photodetector such as a photovoltaic cell can comprise a single crystalline silicon material in which a PN junction is formed by the selective introduction of elemental dopants into a semiconductor body. Doping techniques such as diffusion and ion implantation can be used for this purpose. Metallic electrodes can be placed on the surface of the semiconductor body to form a current collection grid. In operation, incident radiation onto the cell is absorbed within the semiconductor body to create electron-hole pairs or carriers that are separated by the PN junction and made available to energize an external circuit.

Photovoltaic cells include solar cells that can produce direct current electricity from the sun's rays. The current electricity can be used variously for example, to power equipment or to charge a battery. Radiation of photons having a threshold energy level of approximately 1.12 electron volts or higher can create an electron-hole pair in a solar cell semiconductor material. Photons of greater than threshold wavelength having lesser energy may be absorbed by the cell as heat. Since only a percentage of solar radiation is available for energy conversion and since the maximum power of a silicon photovoltaic cell is delivered at about one-half volt rather than 1.12 volts, maximum energy conversion without concentration of radiation is about 22%. However, in practice, other losses reduce conversion to about 10% in typical solar cells.

The efficiency of a solar cell is relatable to its thermal content, decreasing with increasing temperature. Cooling can be provided to a solar cell system by both active and passive system. Active cooling systems include Rankine cycle systems and absorption systems, both of which require additional hardware and costs. Passive cooling systems make use of three natural processes: convection cooling; radiative cooling; and evaporative cooling from outer surfaces exposed to the atmosphere.

The invention relates to an augmented photodetector, method and system, particularly to a thin film configured photodetector. While this invention does not depend on the following explanation, it is believed that the configuration imparts a supplemental electric generation to the photodetector by conversion of a temperature gradient into electricity. A thermoelectric EMF is created as a result of temperature difference between the materials making up the photovoltaic cell. If the materials form a complete loop, the EMF provides a continuous current flow A voltage created can be of an order of several microvolts per degree difference and can be supplemental to the current generated by the cell p-n junction.

In a embodiment, the invention relates to a multifunction photovoltaic cell. A multifunction cell can attain higher total conversion efficiency by capturing a larger portion of an incident light spectrum. In one multijunction cell, individual cells with different bandgaps are stacked on top of one another. The individual cells are stacked so that light, for example solar energy falls first on a material that has a largest bandgap. Photons not absorbed in the first cell are transmitted to a second cell, which then selectively absorbs a higher-energy portion of the light radiation while remaining transparent to lower-energy photons. These selective absorption steps continue through to a final cell, which has the smallest bandgap.

A thin film photovoltaic cell such as a solar cell includes a two component photoactive material; an electron acceptor and an electron donor. The electron donor can be a p-type polymeric conductor material, such as poly(phenylene vinylene) or poly(3-hexylthiophene). The electron acceptor can be a nanoparticulate material, such as, a derivative of fullerene (e.g., 1-(3-methoxy carbonyl)-propyl-1-1-phenyl-(6,6) C61, known as PCBM). Typically, silicone or gallium arsenide is used to fabricate a solar cell can be used. Currently, much interest is directed to cells based on other materials such as carbon fullerenes because of their availability as thin films approaching a nanometer thickness. In a embodiment, the present invention relates to a photovoltaic cell that includes a fullerene material Fullerene is a class of carbon molecule having an even number of carbon atoms arranged in the form of a closed hollow cage wherein the carbon-carbon bonds define a polyhedral structure reminiscent of a soccer ball. The most well studied fullerene is $C_{60}$, Buckminster fullerene. Other known fullerenes include $C_{70}$ and $C_{84}$. Also included is the fullerene nanotube, particularly a single wall nanotube (SWNT). A SWNT is a hollow, tubular molecule consisting essentially of $sp^2$-hybridized carbon atoms typically arranged in hexagons and pentagons. The SWNT can have a diameter in a range of about 0.5 nanometer (nm) to about 3.5 nm and a length that can be greater than about 50 nm.

A SWNT-containing fullerene product can be synthesized by an arc discharge process in the presence of a Group VIIIb transition metal anode, a laser ablation process, a high frequency plasma process, a thermal decomposition process (a chemical vapor deposition (CVD) process and a catalytic chemical vapor deposition (CCVD) process) wherein fullerene is sublimed at a controlled pressure and brought into contact with a heated catalyst, for example as disclosed by Maruyama PN 20060093545, incorporated herein by reference. These syntheses produce a distribution of fullerene reaction products including a SWNT distribution of diameters and conformations and amorphous and other carbon products including multi-wall carbon nanotubes and metallic catalyst residues. The distribution of reaction products varies depending on the process and process operation conditions.

The fullerene can be deposited on a substrate surface using a sputtering approach, by a sublimation technique, by spin coating or by any other suitable technique. In one method, a SWNT-containing fullerene coating can be applied onto a substrate by a solution evaporation technique using solutions of fullerene dissolved in non-polar organic solvents such as benzene, toluene, etc. These processes form a physisorbed coating. In other embodiments, the fullerene coating is applied to a substrate as the fullerene is formed, for example by sublimation as hereinafter described.

Features of the invention will become apparent from the drawings and following detailed discussion, which by way of example without limitation describe preferred embodiments of the invention.

Figure 1:
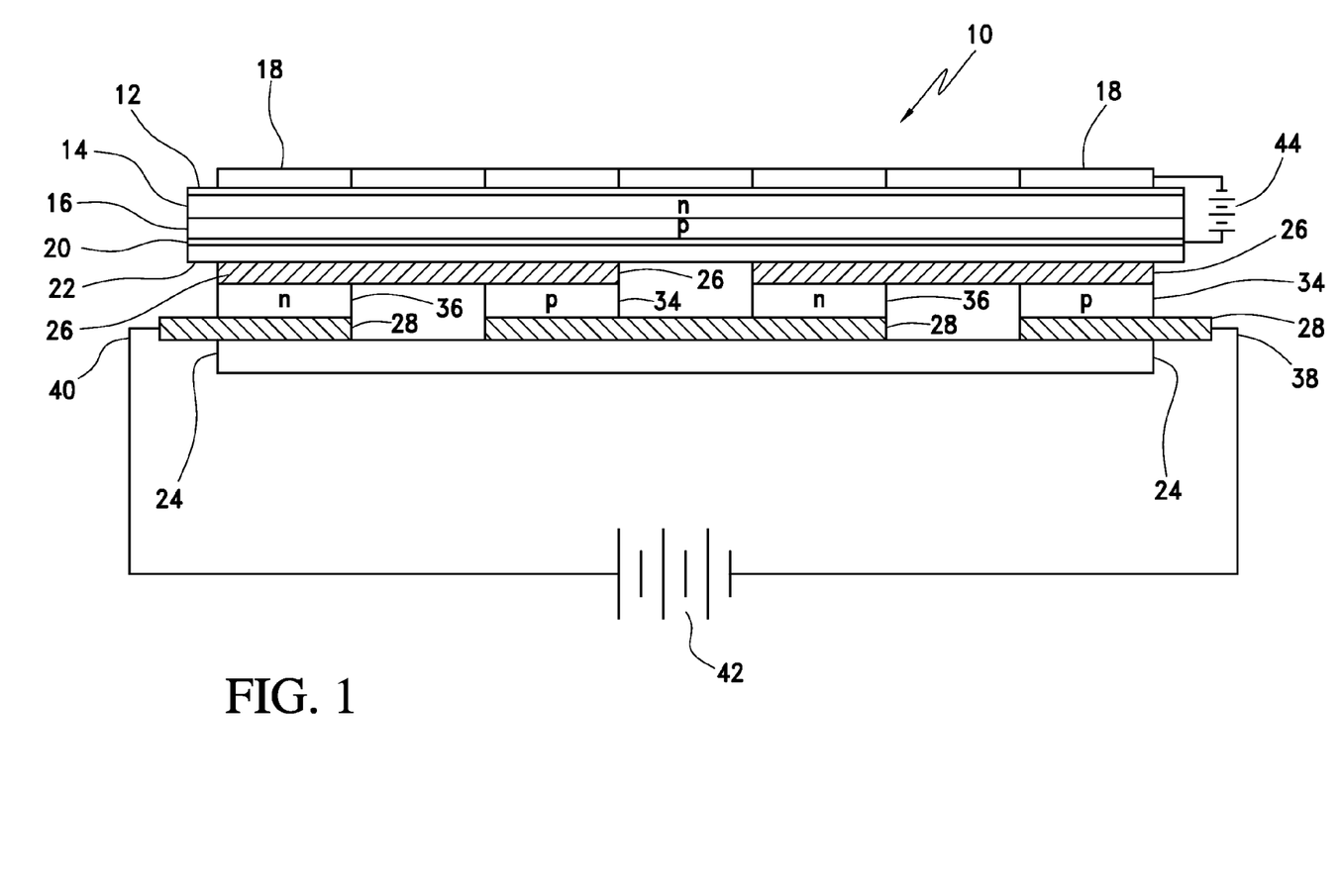
FIG. 1 is a front elevation view of a solar cell.
Figure 2:
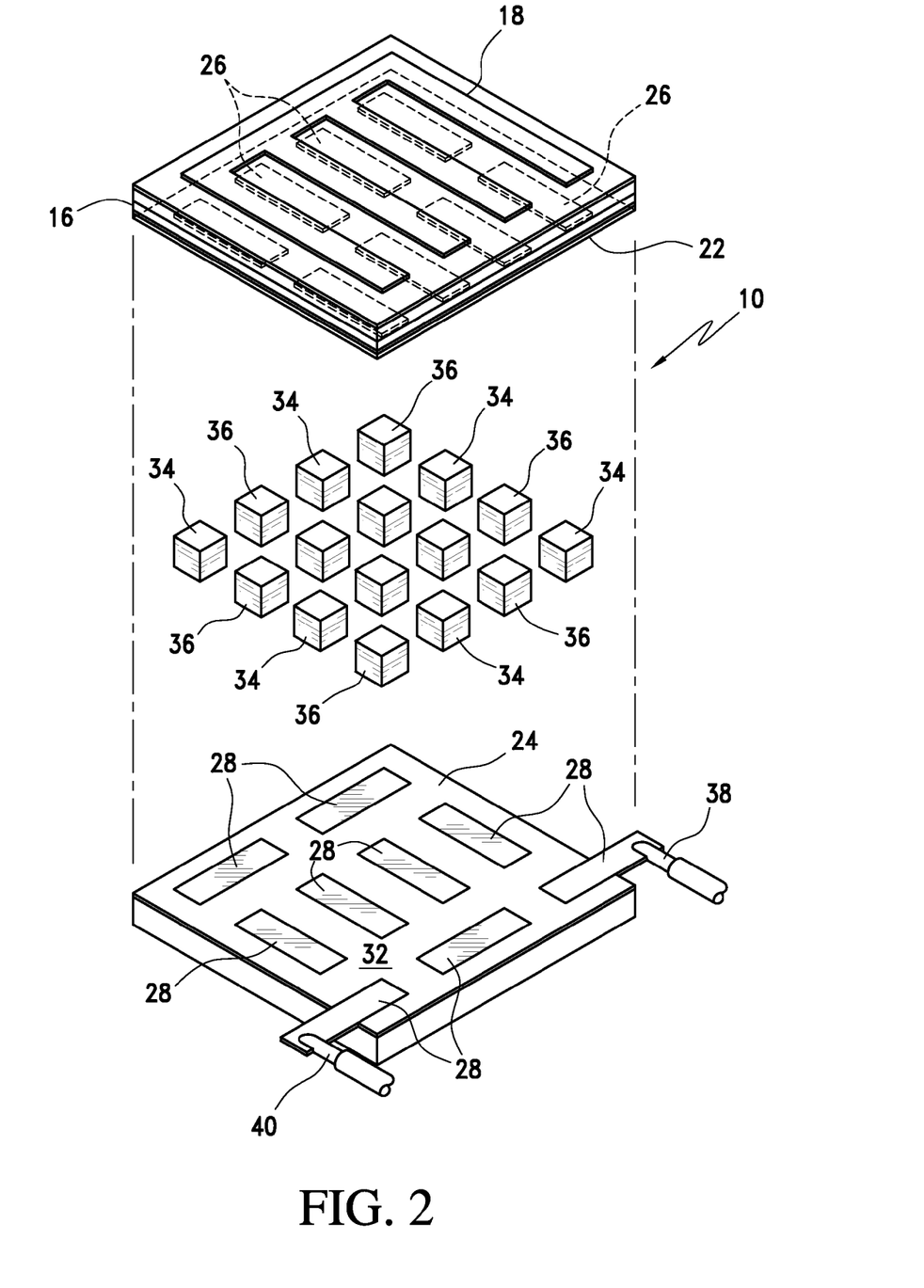
FIG. 2 is a perspective exploded view of a portion of a FIG. 1 solar cell.

FIG. 1 is a schematic front elevation view of a photodetector and FIG. 2 is a schematic exploded view of a FIG. 1 photodetector. The figures illustrate a preferred embodiment of the invention. In FIG. 1 and FIG. 2, the photodetector is represented by high efficiency solar cell 10.

With reference to FIGS. 1 and 2, solar cell 10 comprises an upper section comprising an incident surface that comprises an antireflective film 12 and an n-type material layer 14, p-type material layer 16, upper electrode 18 and lower electrode 20. The n-type layer 14 and p-type layer 16 can be any epitaxial structure that forms a p-n junction of different semiconductor compositions. While FIG. 1 and FIG. 2 show a single p-n junction, the FIG. 1 p-n junction can represent a plurality of p-n junctions. For example, the FIG. 1 structure can represent a top cell of gallium indium phosphide, then a "tunnel junction" to allow the flow of electrons between the cells, and a bottom cell of gallium arsenide. Another cell can include a top cell of n-AlInP$_2$/n-GaInP$_2$/p-GaInP$_2$, a tunnel layer of p-GaInAs/n-GaInAs and a bottom cell of n-GaInAs/p-GaInAs and a p+-GaAs substrate.

The p-n layers 14 and 16 and electrodes 18 and 20 are postured on a lower section that includes electric insulating and thermal transmissive substrate of film 22, which is opposed by corresponding electric insulating and thermal transmissive substrate or film 24. Thin film electrical interconnects 26 and 28 are patterned to respective substrate 22 and 24 surfaces 30, 32 as further shown in FIGS. 3 and 4. The interconnects 22 and 24 are connected in a head to tail fashion by respective p-type semiconductor layers 34 and n-type semiconductor layers 36 to form a continuous electric transmissive pathway as hereinafter described in detail with additional respect to FIGS. 3 and 4.

The electric insulating and thermal transmissive substrates or films 22 and 24 can be the same or different material and each can be any suitable material that provides a path of relatively low thermal impedance from surface 30 of substrate 22 through surface 32 of substrate 24. In a embodiment, "electrically insulating and thermally conductive" material is a material having substantially no free electric charge to permit the flow of electric current so that when a voltage is placed across the material, no charge or current flows. Additionally, the material has a thermal conductivity greater than its connective material; for example such as the substrate 22 in the figures having a thermal conductivity greater than patterned thin film electric interconnect 26 and/or such as the substrate 24 having a thermal conductivity greater than patterned thin film electric interconnect 28. Suitable materials include those with thermal conductivities between 1 to 100 W/m° K or 50 to 100 W/m° K. In embodiments, the electrically insulating and thermally conductive material can comprise a material having a thermal conductivity greater than 3 W/m° K, desirably greater than 4 W/m° K and preferable greater than 20 W/m° K. A high level of thermal conductivity means the substrate 22 and 24 material allows heat to pass through with ease and dissipates the heat evenly, preventing the build up of problematic hot spots.

For example, the substrate 22 and 24 can be a material with a thermal conductivity of greater than 3 W/m° K. Some appropriate materials include a ceramic material such as alumina ($Al_2O_3$), aluminum nitride (AlN), beryllium oxide (BeO) or beryllium nitride ($Be_3N_2$). Other suitable materials include polymer film, epoxy cement film, polymer matrix such as a thermoplastic or thermosetting polymer with or without a ceramic filler, alumina, calcium oxide, titanium oxide, silicon oxide, zinc oxide, silicon nitride, aluminum nitride, boron nitride materials and mixtures thereof, silicone sponge, film, gel or grease, a polycrystalline carbon including an appropriately doped fullerene film, metallic oxide layer such as $Al_2O_3$ and a thermoplastic molding material such as a polyester. The electrically insulating and thermally conductive material can include epoxy materials and epoxy glass laminates. Another suitable "electrically insulating and thermally conductive" material is a thin film high dielectric material impregnated with a fullerene material.

An $Al_2O_3$ ceramic material is one preferred electrically insulating and thermally conductive material. A thermally conductive plastic substrate is another preferred material; for example a thermoplastic or thermosetting polymer matrix having dispersed thermally-conductive electrically-insulating material and optionally a reinforcing material. Polyphenylene sulfide is one suitable polymer. Thermally conductive polymers selected from the group consisting of polystyrene, polyurethane, polyvinyl chloride, polycarbonate, polymethacrylate, polyethylene and polypropylene can be suitable. The dispersed thermally-conductive, electrically-insulating material can be selected from the group consisting of calcium oxide, titanium oxide, silicon oxide, zinc oxide, silicon nitride, aluminum nitride, boron nitride and mixtures thereof. The reinforcing material can be glass, inorganic minerals, or other suitable material which strengthens the polymer matrix. A suitable "electrically insulating and thermally conductive" can comprise a base material having an electrically insulating property, for example a silicone base and a thermally conductive filler.

In one aspect, the invention includes a relatively low melting point material. For example, suitable substrate 22 or 24 materials can include polycarbonates and polymethacrylates. Even polyethylene and polypropylene films may be selected as suitable. These materials can import substantial lightweight and/or flexibility properties.

Figure 3:
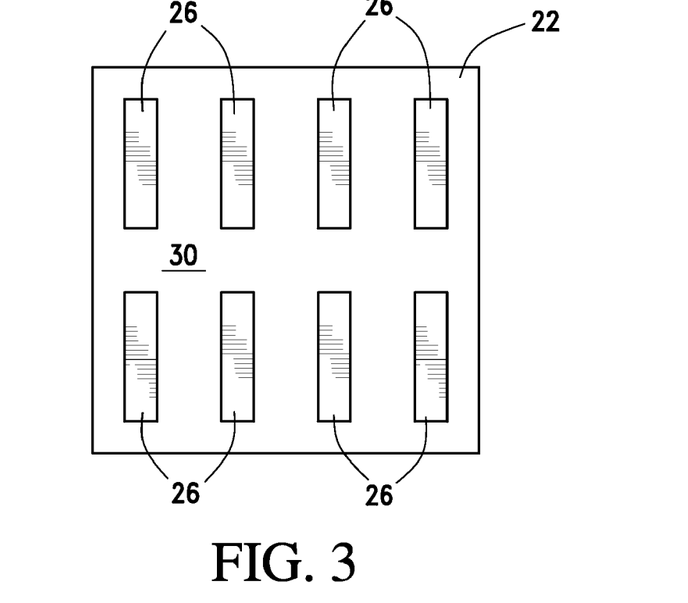
FIG. 3 is a view from the underside of an electric insulating and thermal transmissive substrate of the solar cell.
Figure 4:
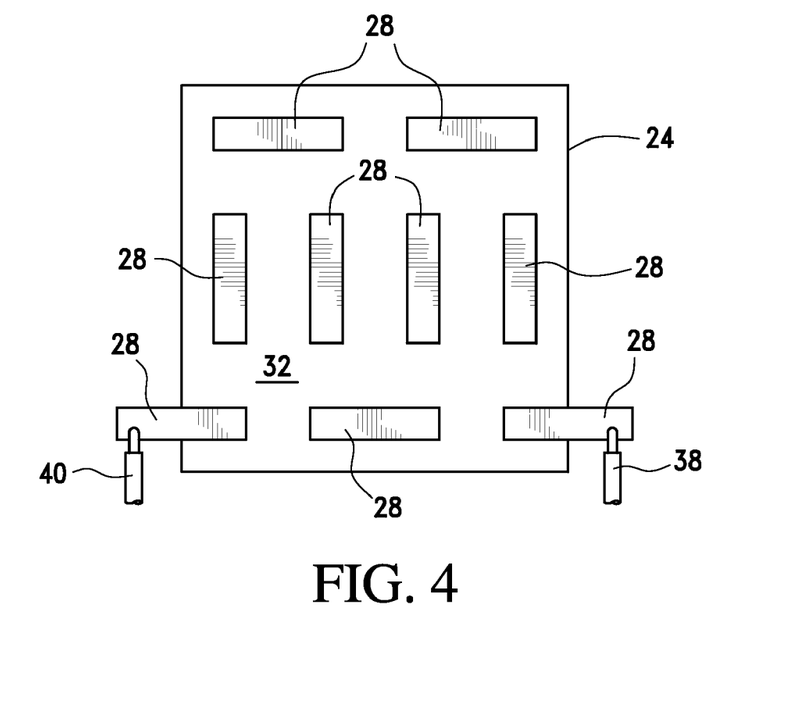
FIG. 4 is a top view an electric insulating and thermal transmissive substrate that complements the FIG. 3 substrate.

In FIGS. 3 and 4, identical parts to be parts of FIGS. 1 and 2 are identified by the same numbers. FIG. 3 is a bottom view of the upper electric insulating and thermal transmissive substrate 22 of solar cell 10 and FIG. 4 is a top view of lower electric insulating and thermal transmissive substrate 24 of cell 10. With reference to FIG. 1, FIG. 2, FIG. 3 and FIG. 4, electric insulating and thermal transmissive substrate 22 is shown with a discontinuous or patterned thin film 26 applied to the substrate 22 surfaced 30. Electric insulating and thermal transmissive substrate 24 is shown with a discontinuous or patterned thin film 28 applied to the substrate 24 surface 32.

The structures 22 and 24 of FIG. 3 and FIG. 4 bear a relationship to one another as illustrated in FIG. 2. The FIG. 2 view is an exploded view of the FIG. 1 solar cell 10. The substrate 22 in FIG. 3 is the FIG. 2 electrical insulator 22 oriented 180° to disclose its underside to show the configuration of thin film 26 on the substrate surface 30. The patterned surface of FIG. 4 substrate 24 comprises a plurality of discontinuous thin film applications 28 that form a system that complements and interacts through layers 34 and 36 (FIGS. 1 and 2) with the second and corresponding patterned thin film 26 on flat substrate surface 30. The FIGS. 1, 2, 3 and 4 taken together illustrate the complementary alignment of thin film patterns 26 and 28. In FIG. 1 and FIG. 2, the FIG. 3 and FIG. 4 electrically insulating and thermally conductive substrates 22, 24 and folded over together with respective thin film patterned interconnects 26 and 28 facing one another, to form opposing plates of a thermoelectric element. The plates (interconnects 26 and 28) are alternately connected head to tail to form a continuous pathway between electrodes 38 and 40. The electrodes 38 and 40 are connected to load 42 as electrodes 18 and 20 are connected to load 44 (FIG. 1). While these figures show separate load 42 and load 44, the FIG. 1 represents any correct connection of circuits to loads, for example, circuits of electrodes 38 and 40 can be connected to a single load in series of parallel with a circuit of electrodes 18 and 20.

The upper portion of solar cell 10, including antireflective film 12, n-type semiconductors 14, p-type semiconductors 16, electrode 18 and electrode 20 and connecting circuit 44, comprises a photovoltaic functioning module. When incident light excites the photoactive material, electrons are released. The released electrons are captured in the form of electrical energy within the electric circuit 44 created between the electrodes 18 and 20. The efficiency of the photoactive materials in generating electric energy is relatable to its thermal content, decreasing with increasing temperature.

A second module of the cell 10 comprises electric insulating and thermal transmissive substrates 22 and 24, patterned thin film electric interconnects 26, patterned thin film electric interconnects 28, p-type semiconductor layers 34, n-type semiconductors layers 36, electrodes 38 and 40 and circuit 44. The electric insulating and thermal transmissive substrate 22 is shown in a heat conductive relationship with the first module via connection to electrode 22 and or a surface of p-type layer 16. In a typical operation, much of the photon energy of incident light on n-layer 14 is not converted to electric current energy but rather is transferred as thermal energy to p-type layer 16. Electric insulating and thermal transmissive substrate 22 initially dissipates some of the thermal energy from the adjacent p-type layer 16 to the cooler corresponding electric insulating and thermal transmissive substrate 24. The substrate 24 acts as a heat sink to set up a thermal gradient from the first module p-type layer and second module electric insulating and thermal transmissive substrate 22, across interconnects 26, 28 and layers 34, 36 to the cooling substrate 24.

The lower module generates electric current from the thermal energy profile between electric insulating and thermal transmissive substrate 22 and corresponding substrate 24. The patterned thin film electric interconnects 26, patterned thin film electric interconnects 28, p-type semiconductors 34 and n-type semiconductors 36 are arranged to provide an end to end electron conducting pathway. The thermoelectric effect of the temperature gradient results in n-type semiconductors 36 of the second module having excessive electrons and the p-type semiconductors 34 having a deficiency, which results in a current flow with load 42. The patterned structures 26 and 28 provide a complementary pathway configuration that converts the thermal energy from the gradient from substrate 22 to substrate 24 into electrical energy (Siebeck effect). The current can be connected with the current through 44 either parallel or serially to supplement the current that is directly generated from the cell 10 photovoltaic effect.

In a embodiment, the cell 10 represents a multijunction cell. A multijunction cell can be constructed from a plurality of independently made cells, at least one with a high bandgap and at least one with a lower bandgap. Then the cells can be stacked, one on top of the other. In another construction, one complete first solar cell can be made and then layers for successive cells can be grown or deposited on the first.

In an embodiment, a photovoltaic cell such as cell solar cell 10, includes semiconductors of opposing conductivity type coupled electrically in series and thermally in parallel by at least one associated patterned thin film electric interconnect, (26 or 28 in the figures), which can be a substantially monolayer film. Preferably, the thin film is applied to a film substrate such as the substrate 22 or 24 of the figures. In an embodiment, the interconnect (26 or 28) thin film can be a fullerence monolayer. As used herein, the term "monolayer" as applied to a film of fullerence means a coating having approximately on layer of fullerene molecules although the properties of the coating may not be significantly affected if the film is slightly more than a molecule thick. Moreover, while a monolayer of fullerene molecules generally packs into a two-dimensional crystalline structure on the substrate, a fullerene coating with minor lattice defects in the monolayer may not alter the desirable properties of the fullerene layer and would be considered a monolayer. Hence in this application, "monolayer" or "monomolecular layer" means a substantially monomolecular thick layer that can be include some molecular overlay and variation in diameter so that the thickness can vary from about 0.5 nm to about 6 nm. Preferably, the monolayer is less than 1 nm thick. In a desired embodiment, the monolayer is less than 1 nm thick to about 3 nm. The monolayer exhibits desirable and even in some instances, enhanced heat dissipating properties without adding significant structure or profile to a thermal energy generating component.

The patterned fullerene electric interconnect 26 or 28 is formed by any suitable method, including a masked vapor deposition process. A suitable vapor-deposition device comprises a reaction chamber capable of maintaining vacuum or lower pressure and a heater such as a resistance heater for vaporizing the fullerene molecules. In one process, the fullerene is sublimed from a powder by heating to a temperature greater than about 450° C. under low pressures, preferably less than about $1 \times 10^{-6}$ torr. Preferred sublimation temperatures are included in a range from about 450° C. to about 550° C. In one process, the fullerene powder is heated to a first lower temperature, preferably from about 200° C. to about 350° C. to remove any solvent or other impurities. In this process, the sublimation step can be conducted at less of a reduced pressure but at a higher temperature. However, it is preferred that the sublimation step is conducted at lower pressure, preferably less than about $1 \times 10^{-8}$ torr.

The heated fullerene molecules form a vapor-deposited film 26 or 28 on the substrate 22 or 24 surface 30 or 32. In these methods, the film can be selectively applied to the substrate surface 30 or 32 using a mask or lattice structure. Or the film can be deposited, a mask or lattice structure applied and the film selectively etched or otherwise removed to provided a fullerene thin film 26 or 28 pattern of the invention. The mask can be a sacrificial material such as a polycrystalline-silicon. In the depositing step, the fullerene powder can be placed in a porous container or tube and the substrate 22 or 24 placed at the tube or container opposite end. The substrate surface 30 or 32 is protected while the powder is brought to sublimation temperature and pressure. When the sublimation pressure and temperature are reached, the substrate surface 30 or 32 is exposed while maintained at a lower temperature. The fullerene vapor condenses onto the substrate surface 30 or 32 and forms to the substrate surface material.

In an embodiment, the substrate 22 or 24 is swept past a fullerene powder source at a rate to provide desired condensation and deposit. Exposure time and sublimation conditions can be monitored by an appropriate device such as real-space STM atomic imaging device to control deposition to a desired fullerene deposit thickness on the substrate surface 30 or 32. One such method comprises positioning a tunneling tip device at a desired detecting position with respect to the substrate 22 or 24 and controlling application of the fullerene thin film to the substrate surface 30 or 32 according to the positioned tunneling tip device. In this embodiment, control can be according to detection of a current between the tip of the device and the fullerene thin film 26 or 28 depositing on the substrate surface 30 or 32.

In another embodiment, the fullerene thin film 26 or 28 is deposited by sublimation from a solution. For example, the carbon thin film can be applied by a Langmuir-Blodgett (LB) technique or by solution evaporation using a solution of fullerene dissolved in a non-polar organic solvent such as benzene or toluene. The resulting solution is loaded into a resistively heated stainless steel tube oven. The oven is placed into a vacuum chamber, which is evacuated to approximately $10^{-6}$ Torr. The oven is then heated to about 150° C. for five minutes. A substrate is rotated above the tube oven opening. The tube is then further heated to at least 450° C., preferably to approximately 550° C. to sublime the fullerene from the solvent onto the substrate surface 30 or 32.

After formation, the fullerene thin film 26 or 28 can be polymerized by methods including photopolymerization, electron beam polymerization, X-ray polymerization, electromagnetic polymerization, micro-wave polymerization method and electronic polymerization. In electron beam polymerization, an electron beam is irradiated from an electron gun. The fullerene molecules are excited by the electron beam and polymerized at an excited state. In X-ray polymerization, X-rays are irradiated from an X-ray tube in place of an electron beam. The fullerene molecules are excited by the X-rays and polymerized at the excited state. These methods produce a fullerene polymer thin film 26 or 28 consisting essentially of fullerene molecules bonded together by covalent bonds.

Suitable plasma polymerization methods include a high-frequency plasma method, a DC plasma method and an ECR plasma method. A typical high-frequency plasma polymerization apparatus can include a vacuum vessel with opposing electrodes. The electrodes are connected to an outer high frequency power source. A molybdenum boat accommodates fullerene starting material within the vessel. The vessel is connected to an external resistance heating power source. In operation, a low-pressure inert gas, such as argon, is introduced into the vacuum vessel. After the vacuum vessel 13 is charged with inert gas, current is supplied to vaporize the fullerene to generate a plasma. The fullerene plasma is illuminated by illuminating electromagnetic waves such as RF plasma, to polymerize the fullerene molecules to deposit as fullerene polymer film. The amount of deposited thin film can be controlled by control of the temperature of the substrate surface 30 or 32. Increasing the temperature, decreases the amount of deposited film. Typically, the substrate surface 30 or 32 is maintained at a temperature 300° C. or less. If plasma power is of the order of 100 W, the temperature need not exceed 70° C. Thickness of the deposited film can be measured to control the film thickness.

As pointed out above, in one method the thin film 26 or 28 patterned structure can fabricated by masking a substrate surface 30 and 32 during a deposition produced or by masking an applied thin film during a subsequent etching step. In the first instance, the mask can define deposition areas to create the patterned areas of the structure of the invention. Typically, the mask is a metal or a ceramic material. However, the mask can be formed of any suitable material. The mask can be made of a material that can be relatively easily removed, such as by physical removal, dissolving in water or in a solvent, by chemically or electrochemically etching, or by vaporizing through heating. The deposition mask can be a metal oxide, such as silicon oxide or aluminum oxide or water-soluble or solvent-soluble salts such as sodium chloride, silver chloride, potassium nitrate, copper sulfate, and indium chloride, or soluble organic materials such as sugar and glucose. The mask material can also be a chemically etchable metal or alloy such as Cu, Ni, Fe, Co, Mo, V, Al, Zn, In, Ag, Cu—Ni alloy, Ni—Fe alloy and others, or base-dissolvable metals such as Al can also be used. The mask can be make of a soluble polymer such as polyvinyl alcohol, polyvinyl acetate, polyacrylamide or acrylonitrile-butadiene-styrene. The removable mask, alternatively, can be a volatile (evaporable) material such as PMMA polymer. These materials can be dissolved in an acid such as hydrochloric acid, aqua regia, or nitric acid, or can be dissolved away in a base solution such as sodium hydroxide or ammonia. The removable layer or mask may also be a vaporizable material such as Zn which can be decomposed or burned away by heat. The mask can be added by physically placing in on the substrate surface 30 or 32 (or on the deposited thin film 26 or 28), by chemical deposition such as electroplating or electroless plating, by physical vapor deposition such as sputtering, evaporation, laser ablation, ion beam deposition, or by chemical vapor decomposition.

In another aspect, the mask can be a metal oxide, such as quartz or sapphire. The metal oxide can be stenciled or patterned into the structures desired, such as holes, circles, and trenches. In another aspect, the deposition targets can be formed by placing an impurity, local defect, or stress on the substrate or the mask. The impurity, local defect, or stress can be placed by x-ray lithography, deep UV lithography, scanning probe lithography, electron bean lithography, ion beam lithography, optical lithography, electrochemical deposition, chemical deposition, electro-oxidation, electroplating, sputtering, thermal diffusion and evaporation, physical vapor deposition, sol-gel deposition, or chemical vapor deposition. In yet another aspect, the location and number of carbon thin films can be controlled by etching at desired location and not etching at all or etching at different rates the areas surrounding the desired area.

Additionally, methods of fabrication of the thin film include lithographic techniques such as optical and scanning probe lithography that fabricate a discontinuance or a structure at a specific location on the substrate. Existing optical and scanning probe lithographic technologies can be used to fabricate holes with controllable diameter at precise locations on the substrate with controllable depth. These methods include x-ray lithography, deep UV lithography, scanning probe lithography, electron beam lithography, ion beam lithography, and optical lithography. Scanning Probe Lithography can be used to fabricate structures, including the holes, with precise control over the of the location and the dimension of the hole. Optical lithography is a technology capable of mass production of structures. Control of the location and dimension of structures, such as the holes, can be performed with precise control.

The thin film patterned substrate 22, 24 can be fabricated by first depositing a thin film according to an above described deposition process or by any other suitable process followed by polymerization of the deposited thin film fullerene. And, the fullerene patterned substrate can be formed and simultaneously polymerized in the same disposition vessel by an exemplary microwave polymerization, electrolytic polymerization or the like. Various polymerization devices and processes are described in Ata et al., U.S. Pat. No. 6,815,067 and Ramm et al., U.S. application Ser. No. 10/439,359 (Publication 20030198021), each of which is incorporated herein by reference in their respective entireties. According to these references, a typical microwave polymerization apparatus includes a molybdenum boat that accommodates fullerene molecules as a starting material. Microwaves generate a depositing fullerene polymer by excitation of vaporized fullerene molecules. An electrolytic polymerization apparatus comprises an electrolytic cell that includes a positive electrode and a negative electrode connected to a potentiostat. A reference electrode is connected to the same potentiostat so that a pre-set electric potential can be applied across the positive/negative electrodes. Fullerene molecules and a supporting electrolyte are charged into the cell. The potentiostat applies a pre-set electrical energy the positive/negative electrodes to form fullerene anionic radicals, which precipitate as a thin fullerene film on the negative electrode and fullerene polymer precipitates and is recovered by filtration or drying and kneading into a resin to form a thin fullerene polymer film.

In some applications of the invention, a thin monolayer fullerene film or fullerene polymer film may be desirable to provide the smallest and lightest possible structure that is an effective conductive structure without changing the electrical insulator substrate properties. In these applications, a thin, even mono-molecular layer can be applied according to one or more procedures. One procedure takes advantage of strong fullerene to substrate bond. The fullerene bond to a metal/semiconductor substrate surface is stronger than inter molecular bonding among fullerene molecules. Desorption temperature is related to bond strength among fullerene molecules or between fullerenes and substrate. Hence, strength of fullerene bonding can be estimated by the temperature at which a fullerene desorbs. For multilayer fullerene molecules on a substrate surface 30 or 32, fullerene desorption temperature is between 225° C. and 300° C. Hence, an applied temperature of higher than 225° C., desirably at least 350° C. and in some applications up to about 450° C. will effect fullerene desorption without disrupting the fullerene to substrate surface 30 or 32 bond. In one process, desorption of excess fullerene beyond a monolayer can be achieved by heating at a temperature from about 225° C. to about 300° C. In one procedure, a fullerene monolayer film is formed by depositing a thin film of fullerene molecules onto the substrate surface 30 or 32 according to any of the above described deposition procedures. Layers of the deposited thin film 26 or 28 are removed to produced a residual film of desired thickness. The layers are removed by selectively breaking fullerene-to-fullerene intermolecular bonds without breaking the fullerene-to-substrate association or bonding and without subjecting the film or substrate to injurious temperatures, by this mechanism, excess fullerene can be removed beyond a desired thickness such as a monolayer, for example by heating to a temperature sufficient to break the fullerene-fullerene bonds without disrupting the fullerene monolayer 26 or 28 that is applied to the substrate surface 30 or 32.

Other methods of selectively breaking the fullerene intermolecular bond include laser beam, ion beam or electron beam selective irradiation. For example, an energetic photon laser beam, electron beam or inert ion beam can be irradiated onto the deposited substrate with a controlled energy that is sufficient to break fullerene-to-fullerene intermolecular bonds without breaking fullerene-to-substrate associations or bonds. The parameters of the beam irradiation depend upon the energy, flux and duration of the beam and also depend on the angle of the beam to the fullerene thin film 26 or 28 deposit. In general, the energy of irradiation is controlled to avoid fullerene molecule decomposition or reaction and to avoid excessive local heating. For example, it is preferred to operate a laser at an energy outside of the ultraviolet range preferably in the visible or infrared range, to avoid reacting fullerene molecules. On the other hand, the laser can be effectively operated in the ultraviolet range to cleave fullerene layers so long as operating conditions such as temperature, pressure and pulsation are controlled. In a preferred embodiment, the laser or other light source is operated in the visible or infrared portion or the spectrum. Light intensity and beam size can be adjusted to produce the desired desorption rate of fullerenes beyond a desired layer thickness such as a monolayer thickness.

If a sublimation step is used to form the initial fullerene thin film, the fullerene layers can be cleaved to a desired thickness in the same vacuum chamber where the substrate surface is cleaned and the fullerene thin film is deposited. Maintaining the substrate under vacuum keeps it clean and reduces beam scattering during irradiation. Additionally the vacuum can prevent fullerene recondensation by removing desorbed fullerene from the irradiation area.

An ion beam is generated by bombarding a molecular flow with high energy electrons that produce an ionization. The ion beam can be directed with electrodes. If an ion beam is used, beam energy and flux should be low enough to avoid decomposing the fullerene or forming higher-ordered fullerene molecules. For example, acceleration voltage can be as high as 3.0 kilovolts for some applications. Desirably, the voltage is between 50 and 1000, and preferably between about 100 and 300 volts. The beam current density can be in the range of about 0.05 to 5.0 mA/cm$^2$ (milliAmperes per square centimeter).

If a gas cluster ion beam is employed, ion clusters are used that have an atomic mass approximating that of the fullerene molecules. A $C_{60}$ fullerene molecule has an atomic mass unit (AMU) of 720. Beams of clustered ions approximating the mass of the fullerene molecules can be used to inject energy into the multilayer fullerene thin film to break the fullerene-to-fullerene intermolecular bond without depreciating the fullerene molecules. Clusters can be formed by expanding an inert as such as argon, through a supersonic nozzle followed by applying an electron beam or electric arc to form clusters.

The angle of incidence of a directed beam to the fullerene thin film can be varied to control dissociation. In one embodiment, a beam angle relative to irradiated target can be selected between about 25° and about 75°, preferably between 40° and 65°. When ion beam irradiation is used, incident angle is determined by balancing factors such as removal efficiency and precision.

In one aspect of the invention, it has been found that fullerene thin films can be applied to certain substrates that would otherwise be damaged by the conditions of thin film application. For example, fullerene cannot be applied to certain lower melting substrates that would otherwise be damage because of the high temperature requirements for fullerene sublimation. According to this embodiment of the invention, an method of applying a fullerene thin film to a substrate that melts at a temperature lower than the application temperature of the fullerene thin film (lower melting substrate) comprises first applying a fullerene thin film to a first higher melting temperature substrate (melting at a temperature higher than the application temperature of the thin film) to produce a first fullerene thin filmed substrate. The first fullerene thin film substrate is placed in contact with a lower melting temperature substrate with a first surface in contact with an exposed fullerene surface of the fullerene thin film substrate to form a two substrate structure with intermediate fullerene thin film between the substrates. A second fullerene deposit is then applied to an exposed surface of the second substrate and the intermediate fullerene deposit between the two substrates is cleaved to produced two fullerene deposit substrates, one of which is the lower melting temperature substrate. The intermediate fullerene deposit functions to dissipate heat away from the lower melting structure while the second deposit is applied at a temperature that otherwise could damage the lower melting substrate.

In an embodiment, the patterned structure 10 is a substrate 22 or 24 comprising deposited fullerene thin film 26 or 28 with or without a property enhancing dopant. The fullerene pattern of the of the invention can act as a hole transport thin film. The performance characteristics of the hole transport thin film can be determined by the ability of the fullerene to transport the charge carrier. Ohmic loss in the fullerene thin film is related to conductivity, which has a direct effect on operating voltage and also can determines the thermal load transportable by the thin film. By doping at least one of the fullerene hole transport thin film patterns 26 or 28 with a suitable acceptor material (p-doping), the charge carrier density and hence the conductivity is increased.

For example for some applications, the thin film fullerene 26 or 28 can be doped with a donor type (n-type) or acceptor type (p-type) dopant. The dopant can be added to improve electric conductivity and heat stability. In an embodiment, the dopant is a polyanion. An alkali metal such a lithium, sodium, rubidium or cesium is another preferred dopant. Other examples of preferred dopants include alkali-earth metals such as calcium, magnesium, and the like; quaternary amine compounds such as tetramethylammonium, tetraethylammonium, tetrapropylammonium, tetrabutylammonium, methyltriethylammonium and dimethyldiethylammonium. Preferably, the fullerene is doped to have an increased charge carrier density and effective charge carrier mobility for use as an element of a thermoelectric element.

In one aspect, a hydrogenated form of an organic compound is mixed as a dopant directly into the fullerene. The hydrogenated form of the organic compound is a neutral, nonionic molecule that can undergo complete sublimation. In the process, hydrogen, carbon monoxide, nitrogen or hydroxy radicals are split off and at least one electron is transferred to the fullerene or from the fullerene. Also, the method can use a salt of the organic dopant. Suitable organic dopants include cyclopentadiene, cycloheptatriene, a six-member heterocyclic condensed ring, a carbinol base or xanthene, acridine, diphenylamine, triphenylamine, azine, oxazine, thiazine or thioxanthene derivative. After mixing of the dopant, the mixture can be stimulated with radiation to transfer a charge from the organic dopant to the fullerene.

The fullerene products of the above described syntheses include only a proportion of SWNT product. An upgraded SWNT product having enhanced thermal properties is desirable in some thermoelectric applications. Processes to obtain a fullerene product comprising an upgraded proportion of SWNT from a product of the above syntheses include contacting a fullerene product in the presence of a transition metal element or alloy under a reduced pressure in an inert gas atmosphere. Some direct processes for obtaining an upgraded SWNT product include catalytic laser irradiation, heat treatment and CCVD processes. For example, one SWNT product with less than about 10 wt % other carbon-containing species can be produced by an all-gas phase method using a gaseous transition metal catalyst and a high pressure CO as a carbon feedstock. However, catalyst residue can be left as an impurity in the product material.

Proportion of SWNT in a fullerene synthesis product can be enriched in accordance with certain other procedures to provide an improved and advantageous upgraded SWNT thermal coating and film. In one procedure, a SWNT-containing reaction product is heated under oxidizing conditions as described in Colbert et al. U.S. Pat. No. 7,115,864, incorporated herein by reference, to provide a product that is enriched in at least 80%, preferably at least 90%, more preferably at least 95% and most preferably over 99% SWNT. In the present application, an upgraded SWNT is a reaction product comprising at least 80% pure SWNT. The upgraded SWNT has been found to be particularly useful as a heat dissipating coating or film in combination with a thermal energy generating component.

In the Colbert et al. upgrade, a SWNT-containing product composition is heated in an aqueous solution of an inorganic oxidant, such as nitric acid, a mixture of hydrogen peroxide and sulfuric acid or potassium permanganate to remove amorphous carbon and other contaminants. The SWNT-containing synthesis product can be refluxed in an aqueous solution of the oxidizing acid at a concentration high enough to etch away the amorphous carbon deposits within a practical time frame, but not so high a concentration that the SWNT material will be etched to a significant degree. Nitric acid at concentrations from 2.0 to 2.6 M is suitable. At atmospheric pressure, the reflux temperature of the aqueous acid solution can be about 102° C.

In a preferred upgrade process, a SWNT-containing product can be refluxed in a nitric acid solution at a concentration of 2.6 M for 24 hours. The upgraded product can be separated from the oxidizing acid by filtration. Preferably, a second 24 hour period of refluxing in a fresh nitric solution of the same concentration can be employed followed by filtration. Refluxing under acidic oxidizing conditions may result in the esterification of some of the nanotubes, or nanotube contaminants. The contaminating ester material may be removed by saponification, for example, by using a sodium hydroxide solution in ethanol at room temperature for 12 hours. Other conditions suitable for saponification of ester linked polymers can be used. For example, saponification can be accomplished with a sodium hydroxide solution in ethanol at room temperature for 12 hours. The SWNT-containing product can be neutralized after the saponification step. Refluxing the SWNT-containing product in 6M aqueous hydrochloric acid for 12 hours is one suitable neutralization.

After oxidation, saponification and neutralization, the SWNT-containing product can be collected by settling or filtration to a thin mat form of purified bundles of SWNT. In a typical example, the upgraded SWNT-containing product is filtered and neutralized to provide a black mat of upgraded SWNT about 100 microns thick. The SWNT in the mat may be of varying lengths and may comprises individual SWNTs and of up to $10^3$ SWNT bundles and mixtures of individual SWNTs of various thicknesses. A product that comprises nanotubes that are homogeneous in length, diameter and/or molecular structure can be recovered from the mat by fractionation. The upgrade SWNT can then be dried, for example by baking at 850° C. in a hydrogen as atmosphere to produce a dry upgraded SWNT product.

According to one Colbert et al. procedure, an initial cleaning in $HNO_3$ can convert amorphous carbon in a SWNT product to various sizes of linked polycyclic compounds. The base solution ionizes most of the polycyclic compounds, making them more soluble in aqueous solution. Then, the SWNT mat product can be refluxed in $HNO_3$. The SWNT product can be filtered and washed with NaOH solution. Next, the filtered SWNT product is polished by stirring in a Sulfuric acid/Nitric acid solution. This step removes essentially all remaining material from the SWNT product that was produced during the nitric acid treatment. Then, the SWNT product is diluted and the product again filtered. The SWNT product is again washed with a NaOH solution.

Smalley et al. U.S. Pat. No. 6,183,713 incorporated herein by reference, discloses a method to make a SWNT reaction product by laser vaporizing a mixture of carbon and one or more Group VIII transition metals. Single-wall carbon nanotubes preferentially form in the vapor. The SWNT product is fixed in a high temperature zone where the Group VIII transition metal catalyzes further SWNT growth. In one Smalley et al. embodiment, two separate laser pulses are utilized with the second pulse timed to be absorbed by the vapor created by the first pulse. Colbert et al. subjected a Smalley et al. two laser method-produced SWNT product to refluxing in nitric acid, one solvent exchange, and sonification in saturated NaOH in ethanol. The product was neutralized and baked in a hydrogen as atmosphere at 850° C. The procedure produced a >99% pure upgraded SWNT that can be applied to a substrate to from the upgrade SWNT film of the inventive thermal dissipating surfacing.

An aligned nanotube, particularly aligned SWNT coating or film is another preferred embodiment of the invention. Aligned carbon nanotube arrays can be synthesized in a hot filament plasma enhanced chemical vapor deposition (HF-PECVD) system. A variety of substrates (metal, glass, silicon, etc) are first coated with nickel nanoparticles and then introduced into the CVD chamber. The method of nickel nanoparticle deposition defines the nanotube site density. Standard aligned carbon nanotube arrays are produced on a nickel sputtering-coated substrate, whereas low site-density carbon nanotube arrays are produced on a nickel electric-chemical-coated substrate.

The fullerene can include a thermal transfer enhancing additive or dopant, for example encapsulation of one or more metal atoms encapsulated inside a fullerene "cage" or NT. Examples include Sc@C-82, Y@C-82, La@C-82, Gd@C-82, La-2@jC-80, Sc-2@C-84 and alkali metal, Fe, Cr and Ni and silicon-doped fullerene film and NT.

Photovoltaic cells can electrically connected in series and/or in parallel to create a photovoltaic module. Typically, two photovoltaic cells are connected in parallel by electrically connecting the cathode of one cell with the cathode of the other cell, and the anode of one cell with the anode of the other cell. In general, two photovoltaic cells are connected in series by electrically connecting the anode on one cell with the cathode of the other cell. In an embodiment, one or more photovoltaic functions are connected in series with one or more thermoelectric functions by connecting a cathode of a cell of the photovoltaic functions with a cathode of a thermoelectric function and an anode of the photovoltaic functioning cell is connected with the anode of the photovoltaic function.

When more power is required than a single cell can deliver, cells can be grouped together to form modules or panels that can be arranged in arrays. Such solar arrays have been used to power orbiting satellites and other spacecraft and in remote areas as a source of power for applications such as roadside emergency telephones, remote sensing, and cathodic protection of pipelines. Decline of cost of these panels or arrays is expanding the range of cost-effective uses, for example to road signs, home power generation, pocket calculators and communication devices and even for grid-connected electricity generation.

Solar cells have many applications. In one application, the cells are used where electrical power from a grid is unavailable, such as in remote area power systems, Earth-orbiting satellites and space probes, consumer system, e.g. handheld calculators or wrist watches, remote radiotelephones and water pumping applications. More recently, they are starting to be used in assemblies of solar modules (photovoltaic arrays) connected to the electricity grid through an inverter, often in combination with a net metering arrangement.

While preferred embodiments of the invention have been described, the present invention is capable of variation and modification and therefore should not be limited to the precise details of the Examples. Thus while the invention has been described relative to a photovoltaic cell preferred embodiment, other preferred embodiments may include infrared sensors, chemical detectors, Photoresistors or light dependent resistors (LDR) photodiodes, photocathodes, pyroelectric detectors, other types of photovoltaic cells, which can operate in photovoltaic mode or photoconductive mode, photomultiplier tubes containing a photocathode, which emits electrons when illuminated, phototubes containing a photocathode, which emits electrons when illuminated and in general behaves as photoresistor, phototransistor, optical detectors that are effectively thermometers, responding purely to the heating effect of the incoming radiation, such as pyroelectric detectors, Golay cells, thermocouples and thermistors and cryogenic detectors are sufficiently sensitive to measure the energy of single x-ray, visible and near infra-red photons (Enss 2005). The invention includes changes and alterations that fall within the purview of the following claims.

What is claimed is:

1. A photodetector, comprising:
   a first section comprising at least one p-n junction that converts photon energy into a separate charge carrier and hole carrier; and
   another section of semiconductors of opposing conductivity type connected electrically in series and thermally in parallel in a heat dissipating and electric generating relationship to the first section,
   wherein the semiconductors of opposing conductivity type comprise at least one p-type semiconductor and at least one n-type semiconductor coupled electrically in series and thermally in parallel by at least one associated surface with a discontinuous patterned monolayer thin film less than 1 nm to about 3 nm thick.

2. The photodetector of claim 1, wherein the semiconductors of opposing conductivity type comprising at least one p-type semiconductor and at least one n-type semiconductor are coupled electrically in series by at least one associated thin film.

3. The photodetector of claim 1, wherein the semiconductors of opposing conductivity type comprising at least one p-type semiconductor and at least one n-type semiconductor are coupled electrically in series and thermally in parallel by at least two surface discontinuous patterned thin films, each surface comprising an arrangement of defined, systematic electrically conductive shapes on a regular flat surface.

4. The photodetector of claim 1, wherein the semiconductors of opposing conductivity type comprising at least one p-type semiconductor and at least one n-type semiconductor are coupled electrically in series and thermally in parallel by two surface discontinuous patterned thin films, each surface comprising an arrangement of defined, systematic electrically conductive shapes on a regular flat surface with associated at least one pair of p-type semiconductor and n-type semiconductor sandwiched between the two films wherein the systematic electrically conductive shapes of respective thin films are complementarily postured to form an uninterrupted conductive circuit with the associated at least one p-type semiconductor and the at least one n-type semi conduct.

5. The photodetector of claim 1, wherein the semiconductors of opposing conductivity type comprising at least one p-type semiconductor and at least one n-type semiconductor are coupled electrically in series and thermally in parallel by at least one associated surface with a discontinuous patterned monolayer thin film less than 1 nm to about 3 nm thick.

6. The photodetector of claim 1, wherein the semiconductors of opposing conductivity type comprising at least one p-type semiconductor and at least one n-type semiconductor are coupled electrically in series and thermally in parallel by at least one associated surface discontinuous fullerene patterned thin film.

7. The photodetector of claim 1, wherein the semiconductors of opposing conductivity type comprising at least one p-type semiconductor and at least one n-type semiconductor are coupled electrically in series and thermally in parallel by at least one associated surface with a discontinuous patterned carbon nanotube thin film.

8. The photodetector of claim 1, wherein the semiconductors of opposing conductivity type comprising at least one p-type semiconductor and at least one n-type semiconductor are coupled electrically in series and thermally in parallel by at least one associated surface with a discontinuous patterned upgraded SWNT thin film.

9. The photodetector of claim 1, wherein the semiconductors of opposing conductivity type comprising at least one p-type semiconductor and at least one n-type semiconductor are coupled electrically in series and thermally in parallel by at least one associated surface with a discontinuous patterned thin film comprising at least 95% SWNT.

10. The photodetector of claim 1, wherein the semiconductors of opposing conductivity type comprising at least one p-type semiconductor and at least one n-type semiconductor are coupled electrically in series and thermally in parallel by at least one associated surface with a discontinuous patterned thin film comprising substantially aligned SWNT.

11. The photodetector of claim 1, comprising an electric insulating and thermal transmissive substrate comprising a semiconductive material in thermal transmissive contact with the first section.

12. The photodetector of claim 1, comprising a first electric insulating and thermal transmissive substrate in thermal conducting contact with the first section and another electric insulating and thermal transmissive film opposing and parallel to the first electric insulating and thermal transmissive substrate or film.

13. A photodetector, comprising:
   a first section comprising at least one p-n junction that converts photon energy into a separate charge carrier and hole carrier;
   another section of semiconductors of opposing conductivity type connected electrically in series and thermally in parallel in a heat dissipating and electric generating relationship to the first section;
   and an electric insulating and thermal transmissive substrate comprising a semiconductive material in thermal transmissive contact with the first section.

14. The photodetector of claim 13, wherein the semiconductors of opposing conductivity type comprise at least one p-type semiconductor and at least one n-type semiconductor coupled electrically in series by at least one associated thin film.

15. The photodetector of claim 13, wherein the semiconductors of opposing conductivity type comprise at least one p-type semiconductor and at least one n-type semiconductor coupled electrically in series and thermally in parallel by at least two surface discontinuous patterned thin films, each surface comprising an arrangement of defined, systematic electrically conductive shapes on a regular flat surface.

16. The photodetector of claim 13, wherein the semiconductors of opposing conductivity type comprise at least one p-type semiconductor and at least one n-type semiconductor coupled electrically in series and thermally in parallel by two surface discontinuous patterned thin films, each surface comprising an arrangement of defined, systematic electrically conductive shapes on a regular flat surface with associated at least one pair of p-type semiconductor and n-type semiconductor sandwiched between the two films wherein the systematic electrically conductive shapes of respective thin films are complementarily postured to form an uninterrupted conductive circuit with the associated at least one p-type semiconductor and the at least one n-type semiconductor.

* * * * *